United States Patent [19]

Greenaway et al.

[11] 4,051,385
[45] Sept. 27, 1977

[54] ACTIVE NETWORKS AND SIGNALLING EQUIPMENT

[75] Inventors: Philip Ernest Greenaway; John Mortimer Rollett, both of London, England

[73] Assignee: The Post Office, London, England

[21] Appl. No.: 694,290

[22] Filed: June 9, 1976

[30] Foreign Application Priority Data

June 11, 1975 United Kingdom ............... 25103/75

[51] Int. Cl.² .................... H04M 1/00; H03H 7/02; H03H 11/00
[52] U.S. Cl. ........................ 307/233 R; 179/84 VF; 307/230; 330/109; 333/80 R
[58] Field of Search .................... 333/80 R, 80 T; 307/230, 233 R, 295; 330/107, 109; 179/84 VF

[56] References Cited

U.S. PATENT DOCUMENTS 3,736,517 5/1973 Lim .................... 333/80 R X
3,824,496 7/1974 Hekimian .................... 333/80 R X Primary Examiner—Paul L. Gensler
Attorney, Agent, or Firm—Kemon & Estabrook

[57] ABSTRACT

An active network incorporating a gyrator, having a first and a second operational amplifier each said operational amplifier having an inverting input and a non-inverting input, the inverting inputs of said first and said second operational amplifiers being directly connected, and wherein the outputs of said first and said second operational amplifiers are resistively connected to the inverting inputs of said operational amplifiers, an input terminal is connected to said non-inverting input of said first operational amplifier which said input terminal is connected resistively to said output of said second operational amplifier, said output of said first operational amplifier is capacitively coupled to said non-inverting input of said second operational amplifier and said non-inverting input of said second operational amplifier is resistively connected to earth.

6 Claims, 6 Drawing Figures

ACTIVE NETWORKS AND SIGNALLING EQUIPMENT

This invention relates to active networks and signalling equipment. The invention is particularly concerned with the use of simulated inductance in tone signal receivers in which the tone signal is used for switching purposes.

According to the present invention there is provided an active network incorporating a gyrator, having a first and a second operational amplifier each said operational amplifier having an inverting input and a non-inverting input, the inverting inputs of said first and said second operational amplifiers being connected, and wherein the outputs of said first and said second operational amplifiers are resistively connected to the inverting inputs of said operational amplifiers, an input terminal is connected to said non-inverting input of said first operational amplifier and said input terminal is connected resistively to said output of said second operational amplifier, said output of said first operational amplifier is capacitively coupled to said non-inverting input of said second operational amplifier and said non-inverting input of said second operational amplifier is resistively connected to earth.

An output terminal may be connected to the output of either said first or said second operational amplifier.

The invention will now be described, by way of example, with reference to the accompanying diagrammatic drawings in which.

Figure 1:
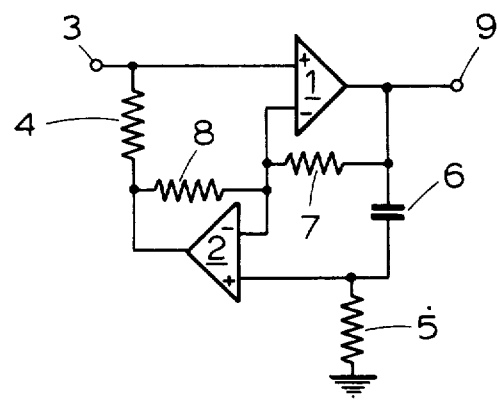
FIG. 1 shows a circuit diagram of the invention.

Referring now to FIG. 1 the active network gyrator circuit includes a pair of operational amplifiers 1 and 2 each of which has two inputs and an output. The non-inverting input of the amplifier 1 is connected directly to an input terminal 3 and by way of a resistor 4 to the output of the amplifier 2. The non-inverting input of the amplifier 2 is connected by way of a resistor 5 to earth and by way of a capacitor 6 to the output of the amplifier 1.

Resistors 7 and 8 are connected between the outputs of the amplifiers 1 and 2 and their inverting inputs respectively. The inverting inputs to the amplifiers 1 and 2 are also directly interconnected.

In operation the circuit simulates an inductance between the terminal 3 and earth. Terminal 3 is directly connected to the amplifier 1, and for suitable values of the components the voltage of the output of the amplifier 1 is related to the voltage at point 3 in a useful manner, so that an output signal may be taken from the output of the amplifier 1 to an output terminal 9 (or for similar reasons from the output of amplifier 2).

By taking an output from the amplifier 1 it eliminates the need for a buffer amplifier to be connected to the terminal 3. This circuit is used in signalling equipment to discriminate between a tone signal of 2,280 Hz and speech signal.

Figure 2:
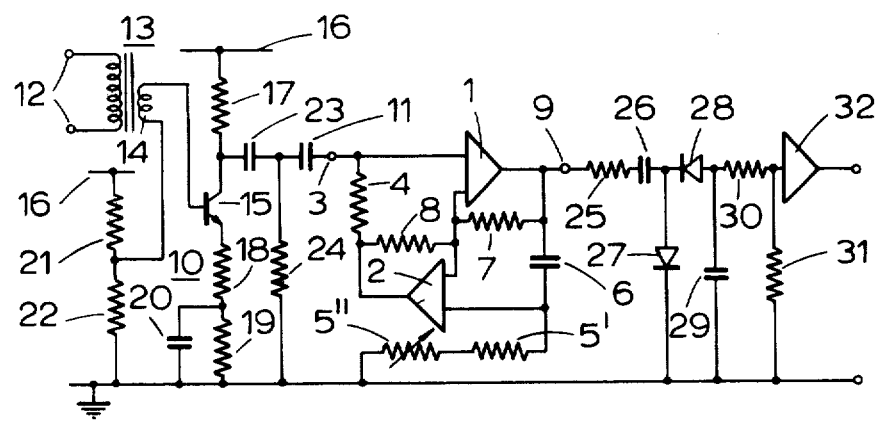
FIG. 2 shows part of a circuit arrangement of a receiver for signalling equipment incorporating the invention.

Part of the signalling equipment containing the frequency discrimination circuit in shown in FIG. 2. Referring now to FIG. 2, the circuit includes a tuned circuit formed by a capacitor and simulated inductance in series. The simulated inductance comprises a gyrator circuit similar to that described with reference to FIG. 1 and the integers of this gyrator circuit are given the same reference numerals as similar integers shown in FIG. 1. The resistor 5 of FIG. 2 comprises a fixed resistor 5' and a variable resistor 5". The gyrator-capacitor circuit of FIG. 2 is coupled to an input amplifier circuit 10 by way of a capacitor 11. The input amplifier 10 receives input signals from a line 12 by way of a transformer 13 having a secondary winding 14 directly connected to the base of a transistor 15. The collector of the transistor 15 is connected to a positive supply line 16 by way of a resistor 17 and the emitter of the transistor 15 is connected to earth by way of a series pair of resistors 18 and 19 the junction between which is coupled to earth by way of a decoupling capacitor 20. The base bias for the transistor 15 is obtained by way of the winding 14 from the junction point between resistors 21 and 22 which are connected in series between the supply line 16 and earth. The output from the input amlifier circuit 10 which is coupled to the capacitor 11, and thence to the gyrator circuit, is derived by way of a capacitor 23 and a resistor 24. The output from the gyrator at terminal 9 is connected by way of a resistor 25 and a capacitor 26 in series to a rectifying network formed by diodes 27 and 28. The rectified output from the diode 28 is integrated by means of a capacitor 29 and resistors 30 and 31 and is then applied to an amplifier 32.

The amplifier circuit 10 has three functions; these are:

i. to provide isolation between the receiver and the speech path, ii. to provide the correct driving resistance, and iii. to have gain such that a specified range of signal levels at the input from the line 12, (i.e. 3dBm to −18dBm,) is transformed to the optimum range of voltage levels for the amplifier-rectifier circuits.

The driving resistance for the tuned circuit is the parallel combination of resistors 17 and 24. The coupling capacitor 23 appears in series with the capacitor 11 of the tuned circuit and has the effect of making the frequency of the signal having a minimum voltage at the junction of capacitor 11 and resistor 24, which signal can be used as a "guard" or "inhibit" signal in some circumstances, slightly lower than the frequency of the signal having a maximum voltage across the simulated inductance. This difference of frequency has little affect on the operation of the equipments since, in practical embodiments, the effective Q of the tuned circuit plus driving resistance may be very low (about 4). The gain of the amplifier circuit 10 may be set so that, for the range of input levels +3dBm to −18dBm, the output voltage of the amplifier 1 falls within the range defined by overload of the amplifier 2 at the high level and by forward voltage of the rectifiers 27 and 28 at the lower level. The amplifier circuit 10 is coupled to the line 12 via a 2 : 1 ratio winding on the input transformer 13 but the change in input impedance has a negligible effect on the input return loss of the signalling equipment. If desired, a buffer amplifier without an input transformer may be used. In such circumstances the single transistor amplifier circuit 10 could be replaced by a balanced differential input stage using two transistors connected directly across the line 12.

The inductance in the series tuned circuit is simulated by the gyrator circuit. It can be shown that if the resistors 4, 5, 7 and 8 have the resistance values R4, R5, R7 and R8 respectively, and if the capacitance of the capacitor 6 is C then the impedance of the circuit is jωC. R4. R5. R7/R8 which is equivalent to an inductance with one terminal earthed.

If the value of the resistor R8 is made equal to the value of any of the resistors R4, R5 or R7 then the value of the simulated inductance L is equal to: C.R4.R5 (assuming that R7 = R8). If the simulated inductance L is connected in a series tuned circuit with a capacitor having a value $C_S$, then the resonant frequency of the tuned circuit is given by: $\frac{1}{2\pi}\sqrt{C_S CR4\ R5}$.

It is convenient to make all the resistor values nominally equal, say to R; the inductance value is then $CR^2$ and if this is turned by a series capacitor which has the value $C_S$, the resonant frequency is $\frac{1}{2\pi}\ R\sqrt{C_S.C}$.

Therefore it is possible to minimize the effects of temperature changes causing variations of the resonant frequency by using resistors and capacitors with equal and opposite temperature coefficients. The capacitors 6 and 11 should have low losses; polystyrene-dielectric capacitors are suitable. To obtain the "operate" signal to be fed to the following circuit, it is necessary to derive a voltage proportional to the voltage across the simulated inductance (the voltage at the terminal 3) without loading it and reducing the Q of the tuned circuit. Such a voltage is available from the output terminal 9, or from the output of the operational amplifier, as the outputs from both amplifiers are low impedance they can be loaded without significantly affecting the tuned circuit. It can be shown that the output voltage of the amlifier 1 is (V-V/jωCR) where V is the voltage across the simulated inductance (at the terminal 3).

Gyrator circuits of the type shown in FIG. 1 have low sensitivity to small changes in the values of the components. The Q of the simulated inductance is generally high, and can be positive or negative depending upon the distribution and magnitude of the stray capacitance.

Care must be taken in the layout of the circuit to keep the capacitive coupling between the components of the circuit low, especially from the junction of the resistors 7 and 8 to earth or to either of the amplifier output terminals. The effect of stray capacitance is worse when the values of the resistances are high; therefore the resistance values should be low consistent with a reasonably low value for the capacitor 6 and an acceptable effective load resistance for the amplifier. In a practical circuit, using 33 kilohm resistors for each of the resistors R4, R5, R7 and R8 and 0.005 pF capacitors for the capacitor C6 the Q is high (about 600) and is not too sensitive to strays. Suitable amplifiers for the differential input amplifiers 1 and 2 are sold by several manufacturers under the general type and one specific example is made by Motorola under the type number MC 1741CG.

It will be appreciated that the gyrator is also applicable to other arrangements requiring simulated inductance. In some tone signal receivers it is necessary to attenuate an unwanted tone, in order that the operation of the detection equipment shall not be impaired. In particular, in telephone signalling systems, dial tone may be present. A tone signal receiver may have to operate in the presence of dial tone, but normal dial tone has harmonic components extending into the signalling band used for multi-frequency telephone tone signalling. The dial tone will have been filtered at source to attenuate harmonics above 650 Hz to a level which will not affect the multi-frequency signalling.

Figure 3:
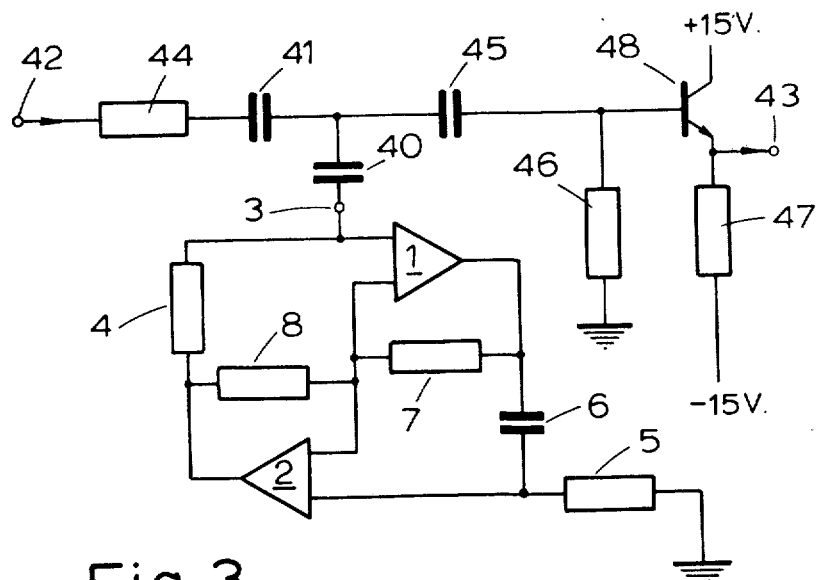
FIG. 3 shows a filter circuit for a receiver for signalling equipment incorporating the invention.

There is shown in FIG. 3 a dial tone filter in which the components of dial tone up to 650 Hz can be removed by a high pass filter which incorporates the gyrator circuit shown in FIG. 1. The criteria used in the design of this dial tone filter are that the attenuation in the pass band should not vary by more than 0.5 dB from 680 Hz to 1670 Hz and all the components of dial tone should be attenuated to below −30 dBm. The circuit arrangement is based on an equally terminated LC filter with the inductance replaced by the gyrator circuit of FIG. 1. In FIG. 3 the integers of the gyrator circuit are given the same reference numerals as similar integers shown in FIG. 1.

The signals, including dial tone, are applied to an input port between an input terminal 42 and earth. The signals at the terminal 42 are coupled by way of resistor 44 to the filter composed of capacitors 41, 45 and 40 and the gyrator circuit of FIG. 1. The filter output from the capacitor 45 is applied to an emitter-follower buffer amplifier composed of a resistor 47 and a transistor 48. A resistor 46 provides the correct terminating impedance for the filter circuit and bias for the base of the transistor 48.

In practical realisation of this circuit it is advantageous if the resistances of the resistors have preferred values.

Component values used in a circuit for filtering standard United Kingdom dial tone were:

resistor 44 = 75 kilohms and 110 kilohms in parallel;
resistor 46 = 110 kilohms and 160 kilohms in parallel;
resistor 47 = 51 kilohms;
resistor 4 = 36 kilohms;
resistor 8 = 39 kilohms;
resistor 7 = 36 kilohms;
resistor 5 = 36 kilohms;
capacitor 41 = 1.5nF;
capacitor 45 = 3nF; and
capacitor 40 = 13nF.

Figure 4:
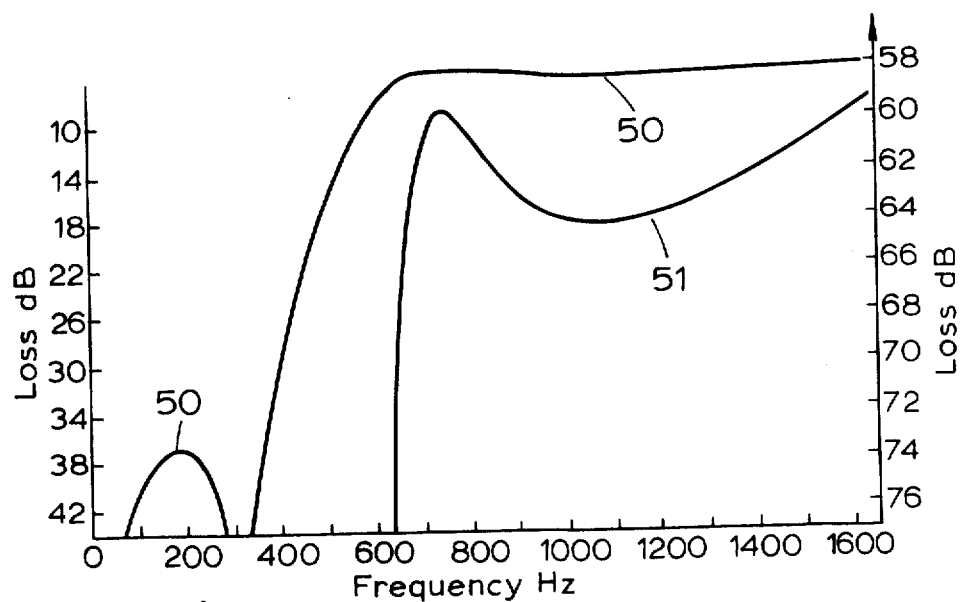
FIG. 4 shows the response curve of the filter circuit shown in FIG. 3.

The frequency response of the dial tone filter of FIG. 3 is shown graphically in FIG. 4, where line 50 shows the response against the normal scale on the left-hand-side of the diagram and 51 shows the response on an expanded scale on the right-hand side of the diagram. A further application for the active network circuit in FIG. 1 is in a tuned circuit and detector in a tone signalling receiver.

Figure 5:
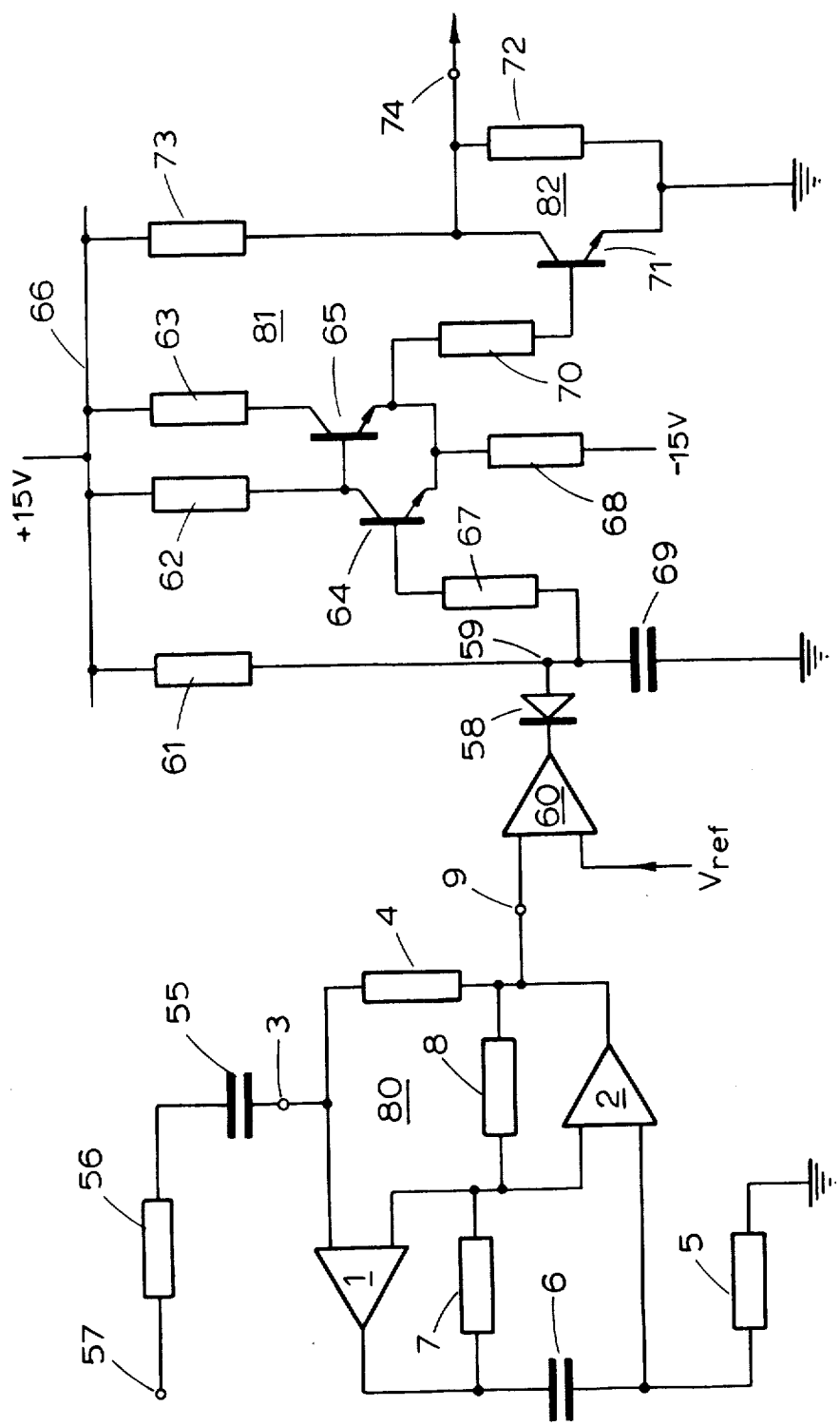
FIG. 5 shows a tuned circuit and detector incorporating the invention in a receiver for signalling equipment.
Figure 6:
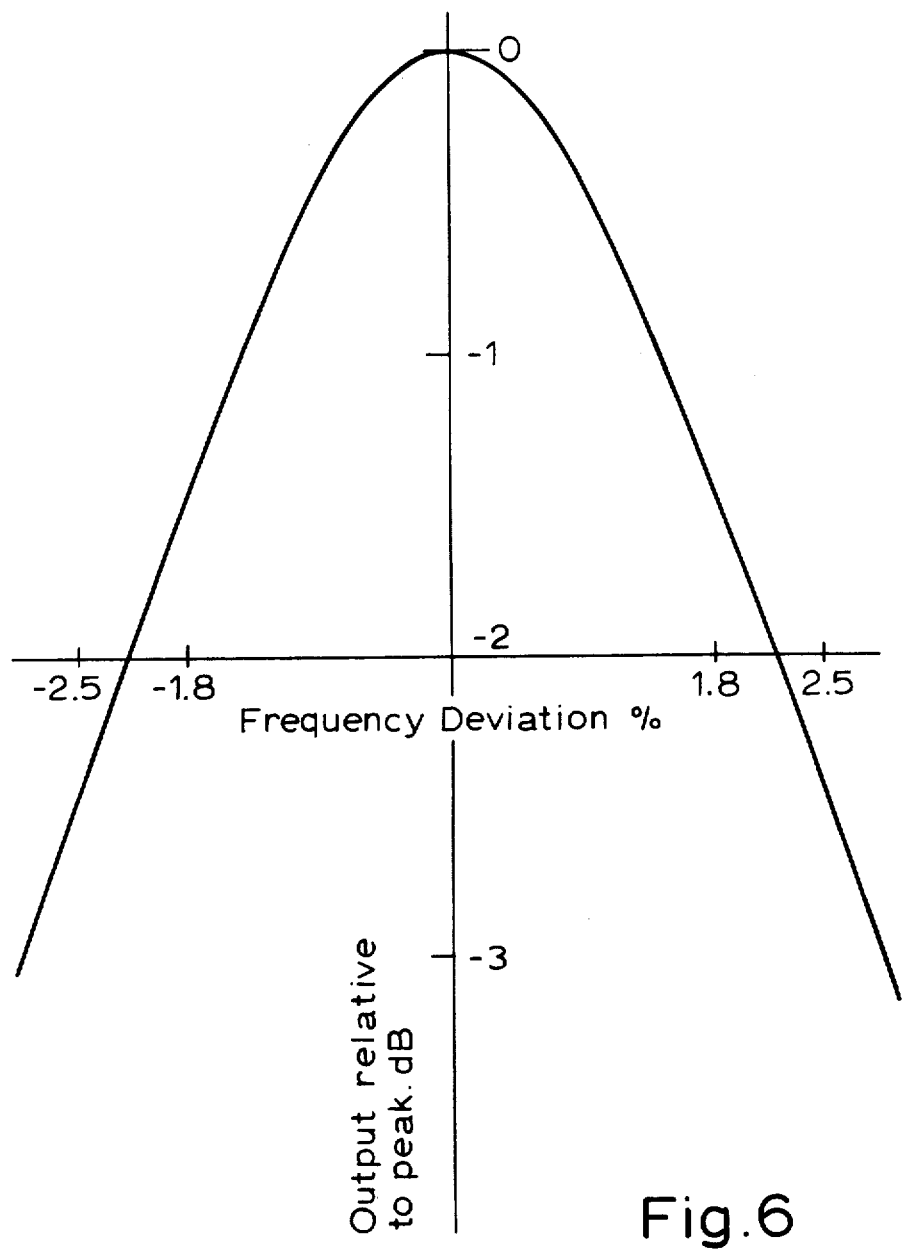
FIG. 6 shows the frequency response curve of the circuit arrangement shown in FIG. 5.

Referring now to FIG. 5 there is shown a frequency-discrimination circit incorporating the gyrator circuit of FIG. 1 which can detect a given frequency. A tuned circuit 80 includes a capacitor 55 and an inductance simulated by the gyrator circuit of FIG. 1. In FIG. 5 similar integers are given the same reference numerals as in FIG. 1. A resistance 56 is provided between the input terminal 57 and the capacitor 55 in order to provide the correct input impedance. A tuned circuit 80 is coupled via its output terminal 9 to a detector circuit. A differential input operational amplifier 60 is used as the detector because it has good discrimination and variations of the input offset voltage are small. The inverting input of the operational amplifier 60 is connected to the output of operational amplifier 2 and the non-inverting input is connected to a reference voltage $V_{ref}$ which is about 7V. The resonant response at the terminal 9 is shown graphically in FIG. 6. The output of the amplifier 60 is coupled by way of a diode 58 to a junction 59 between a resistor 61 and a capacitor 69 connected in series between a +15 volt supply line 66 and earth. The junction 59 is connected via a resistor 67 to the input of an output trigger circuit 81 having transistors 64 and 65 as the active components. The transistors 64 and 65 are NPN transistors and have their commoned emitters connected to a −15 volt supply by way of a resistor 68. The collectors of the transistors 64 and 65 are coupled to the +15 volt supply line 66 by way of resistors 62 and 63 respectively. The output of the trigger circuit 81 is coupled to an output circuit 82 via resistor 70 to the base of a transistor 71 which provides, from its collector electrode, the output signal of the tone signalling receiver. The output circuit 82 is coupled to the output line by a matching resistor 72 between earth and the collector of the transistor 71 which is connected via a resistor 73 to the line 66.

In operation, while the output voltage from the operational amplifier 2 is less than $V_{ref}$, the output of operational amplifier 60 remains at about +13V, which reverse biases diode 58 and allows capacitor 69 to be charged to about +0.5V from the +15V supply via resistor 61.

When the capacitor 69 is charged to +0.5V, transistor 64 is conducting and transistor 65 is non-conducting and the common emitter voltage is 2.9V. Thus, the output transistor 71 is cut off and, due to the proportioning of the resistors 72 and 73, is passed to logic circuit (not shown) from the output terminal 74. The voltage at terminal 9 is approximately 2 times the voltage at terminal 3. When the output voltage from the operational amplifier 2 becomes greater than $V_{ref}$ as it does at positive peaks of the frequency to which the tuned circuit is sensitive, the output of operational amplifier 60 becomes negative and capacitor 69 is rapidly charged to about −13V. This causes transistor 64 to be cut off and transistor 65 to be saturated. This causes the common emitter voltage to rise to +2.6V, causing output transistor 71 to be saturated and thus pass a voltage close to zero (earth) to the terminal 74 and hence the logic circuit. Between the positive peaks of the signal output from the operational amplifier 2, the output of operational amplifier 60 becomes positive and capacitor 69 charges towards the potential of the +15V supply line 66 +15V resistor 61. The charging time constant given by the product of capacitance of capacitor 69 and the resistance of resistor 61 is arranged to give a 3.5 to 4.5ms delay before the trigger circuit 81 changes state. This delay bridges the gap between positive peaks of the output voltage from operational amplifier 2 and enables the receiver to ignore short breaks of up to about 3ms in the tone signal input.

In one practical circuit the following component values were used:

resistor 56 = 2 kilohms;
resistors 4, 7 and 8 = 36 kilohms;
resistor 61 = 510 kilohms;
resistor 62 = 15 kilohms;
resistor 63 = 12 kilohms;
resistor 73 = 15 kilohms;
resistor 72 = 7.5 kilohms;
resistor 67 = 100 kilohms;
resistor 68 = 10 kilohms;
resistor 70 = 47 kilohms; and
capacitor 69 = 0.01 F.

The capacitance of capacitors 55 and 6 and the resistance of the resistor 5 are determined by the resonant frequency to which it is desired to tune the circuit.

Although the component configuration is critical, it will be appreciated that there are many further applications for the gyrator circuit of FIG. 1, and those described in this specification are intended as examples of the use of a simulated inductance inductance in telephone signalling equipment.

What we claim is:

1. An active network incorporating a gyrator, having a first and a second operational amplifier each said operational amplifier having an inverting input and a non-inverting input, the inverting inputs of said first and said second operational amplifiers being directly connected, and wherein the outputs of each of said first and said second operational amplifiers are resistively connected to the inverting inputs of their respective operational amplifiers, an input terminal connected to said non-inverting input of said first operational amplifier which said input terminal is connected resistively to said output of said second operational amplifier, said output of said first operational amplifier is capacitively coupled to said non-inverting input of said second operational amplifier and said non-inverting input of said second operational amplifier is resistively connected to earth.

2. An active network as claimed in claim 1 in which an output terminal is directly connected to the output of one of said operational amplifiers.

3. A series tuned circuit including a capacitor and an inductance simulated by an active network as claimed in claim 1.

4. A frequency discrimination circuit including a series tuned circuit having an input and an output the inductive portion of which is a gyrator as defined by claim 1; an amplifier having its output connected to the input of said tuned circuit; rectifier means connected to the output of said tuned circuit; and an amplifier connected to said rectifying means.

5. A high pass "T" filter circuit having a gyrator as defined by claim 1 simulating an inductance connected in series with a capacitor as the leg of the "T".

6. A frequency detection circuit having a series resonant tuned circuit connected between the input and ground the inductive portion of said tuned circit being a gyrator as defined by claim 1; a detector comprising a differential input operational amplifier connected to the output of said tuned circuit; and a trigger circuit coupled to the output of said detector.

* * * * *